United States Patent
Eskridge et al.

(10) Patent No.: US 6,910,379 B2
(45) Date of Patent: Jun. 28, 2005

(54) OUT-OF-PLANE COMPENSATION SUSPENSION FOR AN ACCELEROMETER

(75) Inventors: Mark H. Eskridge, Renton, WA (US); Gary J. Ballas, Kirkland, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/696,323

(22) Filed: Oct. 29, 2003

(65) Prior Publication Data

US 2005/0092107 A1    May 5, 2005

(51) Int. Cl.[7] .......................... G01C 19/00; G01P 15/00
(52) U.S. Cl. ................................ 73/504.14; 73/514.02
(58) Field of Search ........................ 73/504.04, 504.12, 73/504.13, 504.14, 594.15, 504.02, 514.32, 73/514.29, 504.16, 514.01, 514.02

(56) References Cited

U.S. PATENT DOCUMENTS

| | | |
|---|---|---|
| 4,945,765 A | 8/1990 | Roszhart |
| 5,006,487 A | 4/1991 | Stokes |
| 6,028,332 A * | 2/2000 | Kano et al. .................. 257/254 |
| 6,257,059 B1 * | 7/2001 | Weinberg et al. ........ 73/504.16 |

* cited by examiner

Primary Examiner—Helen C. Kwok
(74) Attorney, Agent, or Firm—Charles J. Rupnick, Attorney at Law

(57) ABSTRACT

A high aspect ratio microelectromechanical system device for measuring an applied force and having a suspension structure for compensating out-of-plane displacements of the device proof mass, wherein the device includes a frame; a proof mass coupled to the frame for in-plane motion along an axis of symmetry, the proof mass having first and second sets of spaced apart capacitor plates projected therefrom on each side of the axis of symmetry and oriented substantially crosswise to the axis of symmetry; and third and fourth sets of spaced apart capacitor plates oriented substantially crosswise to the axis of symmetry of the proof mass and intermeshed respectively with the first and second sets of capacitor plates, the third and fourth sets of capacitor plates being suspended for motion relative to the frame about respective first and second axes of motion oriented substantially parallel with the axis of symmetry of the proof mass.

22 Claims, 2 Drawing Sheets

OUT-OF-PLANE COMPENSATION SUSPENSION FOR AN ACCELEROMETER

FIELD OF THE INVENTION

The present invention relates to micromachined accelerometer devices, and in particular to suspension structures for compensating out-of-plane displacements of the proof mass of micro-machined accelerometers incorporating one or more comb-type capacitive readout force transducers for measuring the force applied to a proof mass and methods for manufacturing the same.

BACKGROUND OF THE INVENTION

A widely used technique for force detection and measurement employs a mechanical capacitive readout force transducer having a capacitive output proportional to the force applied. In one such mechanical transducer, one or more capacitors are formed between an instrument frame and a proof mass suspended by a flexure. A force applied to the proof mass along a particular axis will cause displacement of the proof mass relative to the frame, which varies the capacitive output of the capacitors. The force applied to the proof mass is quantified by measuring a resultant change in capacitance.

Such a micro-accelerometer is a combination of mechanical structure comprising the proof mass, suspension flexure, and fixed instrument framework, and electrical structure comprising capacitor electrodes, current-feed connections, and external circuitry forming a capacitor circuit.

More precisely, a micromachined proof mass is connected by a flexure to a fixed instrument frame forming a part of the framework of the transducer. A capacitor is formed between one or more electrode surfaces of the hinged proof mass and opposing surfaces of cooperating fixed electrodes of the instrument frame. Movement of the proof mass electrode surfaces relative to the cooperating fixed electrodes changes the value of the capacitor of the capacitor circuit. This variation in the capacitor value depends on the relative movement of the proof mass by forces, i.e., acceleration, applied to the proof mass. A change in the measurement of the capacitor therefore represents an acceleration measurement.

According to one well-known technique, the proof mass's electrodes and cooperating fixed electrodes are formed having intermeshing comb-like fingers wherein a large quantity of substantially parallel-plate capacitors are formed between the opposing surfaces of the fixed electrode and proof mass fingers.

Capacitive readout force transducers employing such intermeshing comb-like fingers have been fabricated from a body of semiconductor material, such as silicon, as microelectromechanical systems, or "MEMS," integrated micro devices or systems combining electrical and mechanical components fabricated using integrated circuit (IC) batch processing techniques.

In the most general form, MEMS consist of mechanical microstructures, microsensors, microactuators and electronics integrated in the same environment, i.e., on a silicon chip. MEMS is an enabling technology in the field of solid-state transducers, i.e., sensors and actuators. The microfabrication technology enables fabrication of large arrays of devices, which individually perform simple tasks but in combination can accomplish complicated functions. Current applications include accelerometers, pressure, chemical and flow sensors, micro-optics, optical scanners, and fluid pumps. For example, one micromachining technique involves masking a body of silicon in a desired pattern, and then deep etching the silicon to remove unmasked portions thereof. The resulting three-dimensional silicon structure functions as a miniature mechanical force sensing device, such as an accelerometer that includes a proof mass suspended by a flexure. Existing techniques for manufacturing these miniature devices are described in U.S. Pat. No. 5,006,487, "Method of Making an Electrostatic Silicon Accelerometer" and U.S. Pat. No. 4,945,765 "SILICON MICROMACHINED ACCELEROMETER," the complete disclosures of which are incorporated herein by reference.

High aspect ratio MEMS or "HIMEMS" is one known process for producing such MEMS devices, including MEMS accelerometer devices. HIMEMS permits fabrication of intricate device designs in two dimensions, but requires a fixed device thickness, on the order of a cookie cutter. Capacitive readout in-plane accelerometers fabricated as HIMEMS devices may includes a proof mass suspended on flexures with a quantity of fingers formed along its edges, the fingers on the proof mass intermeshing with cooperating electrode fingers on a fixed structure to form a quantity of capacitors therebetween. As the proof mass moves in response to an applied force, the intermeshing fingers of the proof mass approach or recede from the fingers of the fixed structure, whereby capacitance therebetween increases or decreases. The change in capacitance between fingers is a measure of the force applied to the proof mass, which can be interpreted as an acceleration signal. One problem with such capacitive readout in-plane accelerometers is that, when fabricated as HIMEMS devices, forces applied out-of-plane relative to the intermeshing fingers causes out-of-plane separation or "de-meshing" of the fingers, which decreases the inter-finger capacitance and registers as a decrease in the applied force or acceleration. This out-of-plane separation or "de-meshing" of the fingers is a device "cross-axis sensitivity" that results in a decrease of inter-finger capacitance whether the out-of-plane force or acceleration is applied positively or negatively.

SUMMARY OF THE INVENTION

The present invention substantially reduces or eliminates the out-of-plane separation or de-meshing of the device fingers the resulting cross-axis sensitivity by suspending the traditionally fixed electrode structure so that, while substantially fixed against motion in the sensitive axis and in-plane cross-axis directions, the electrode structure is responsive to a force applied out-of-plane to move out-of-plane in a direction and by an amount substantially the same as those of the proof mass.

The traditionally fixed electrode structure is structured to pivot on torsional or other rotational flexures from a fixed base structure such that the electrode fingers rotate to at least partially match the out-of-plane deflection of the proof mass electrode fingers.

Accordingly, a suspension structure is provided for a high aspect ratio HIMEMS device for measuring an applied force, wherein the device is provided with an instrument frame; a proof mass coupled to the frame for in-plane motion along an axis of symmetry, the proof mass having first and second sets of spaced-apart capacitor plates projected therefrom on each side of the axis of symmetry and oriented substantially crosswise to the axis of symmetry; and third and fourth sets of spaced apart capacitor plates oriented substantially crosswise to the axis of symmetry of the proof mass and intermeshed respectively with the first and second sets of capacitor plates, the third and fourth sets of capacitor plates being suspended for rotation relative to the frame about respective first and second axes of rotation oriented substantially parallel with the axis of symmetry of the proof mass.

According to another aspect of the invention, the third and fourth sets of capacitor plates being suspended for rotation relative to the frame by first and second torsional flexures respectively coupled between the third and fourth sets of capacitor plates and the frame.

According to another aspect of the invention, each of the first and second torsional flexures is fabricated as a pair of torsional flexures spaced at opposite ends of the respective third and fourth sets of capacitor plates.

According to another aspect of the invention, the HIMEMS device includes an attachment structure coupled between each of the first and second torsional flexures and the frame.

According to yet another aspect of the invention, each of the torsional flexures is formed as a beam-shaped flexure having a length dimension measured along the respective axis of rotation that is greater than a width dimension measured crosswise to the axis of symmetry of the proof mass.

According to still other aspects of the invention, methods are provided for forming a suspension structure for compensating out-of-plane displacements of a proof mass of a high aspect ratio microelectromechanical system device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1 and 2 illustrate a known capacitive readout in-plane accelerometer fabricated as a high aspect ratio MEMS or HIMEMS device that suffers from cross-axis sensitivity, wherein FIG. 1 is a plan view and FIG. 2 is an end-on cross-sectional view taken through the device illustrated in FIG. 1; and FIGS. 3 and 4 illustrate the suspension apparatus and method of the invention for compensating out-of-plane displacements of a proof mass in an exemplary in-plane capacitive readout force transducer fabricated as a high aspect ratio MEMS or HIMEMS force measuring device, wherein FIG. 3 is a top-down plan view and FIG. 4 is an end-on cross-sectional view taken through the device illustrated in FIG. 3.

DETAILED DESCRIPTION OF PREFERRED EMBODIMENT

In the Figures, like numerals indicate like elements.

The present invention is a suspension apparatus and method for compensating out-of-plane displacements of a proof mass in an in-plane comb-type capacitive readout force transducer fabricated as a high aspect ratio MEMS or HIMEMS device for measuring an applied force, such as an accelerometer, wherein the HIMEMS device includes an instrument frame forming a part of the framework of the transducer;

a substrate of substantially uniform thickness having formed therein a proof mass of substantially uniform width and being suspended by one or more flexures at each of two opposing ends for motion relative to the frame in the plane of the substrate and along an axis crosswise to its width, the proof mass having on each of two edges spaced apart by its width a quantity of outwardly projected fingers spaced along its length and aligned substantially crosswise to its axis of motion and forming individual substantially planar capacitor plates oriented substantially crosswise to its axis of motion; and first and second quantities of fixed electrode fingers formed in the substrate and spaced on opposite sides of the proof mass and substantially fixedly secured to the frame relative to the axis of motion of the proof mass, the first and second quantities of fixed electrode fingers being inwardly projected toward the proof mass and inter-spaced with the outwardly projected fingers spaced along the length of the proof mass and forming individual substantially planar capacitor plates oriented substantially crosswise to the axis of motion of the proof mass and cooperating with the capacitor plates of the proof mass for forming individual capacitors therebetween when an electrical current is applied thereto, each of the first and second quantities of fixed electrode fingers being suspended by one or more torsional flexures for rotation relative to the frame about respective axes aligned substantially parallel with the axis of motion of the proof mass.

Figure 2:
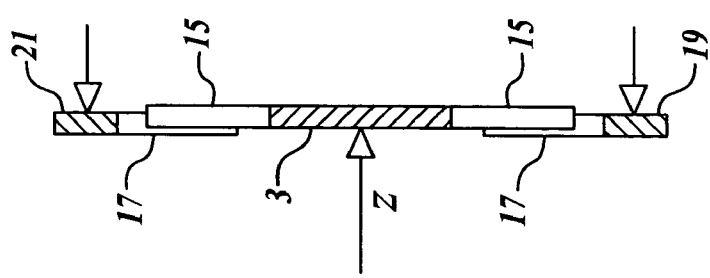
Figure 1:
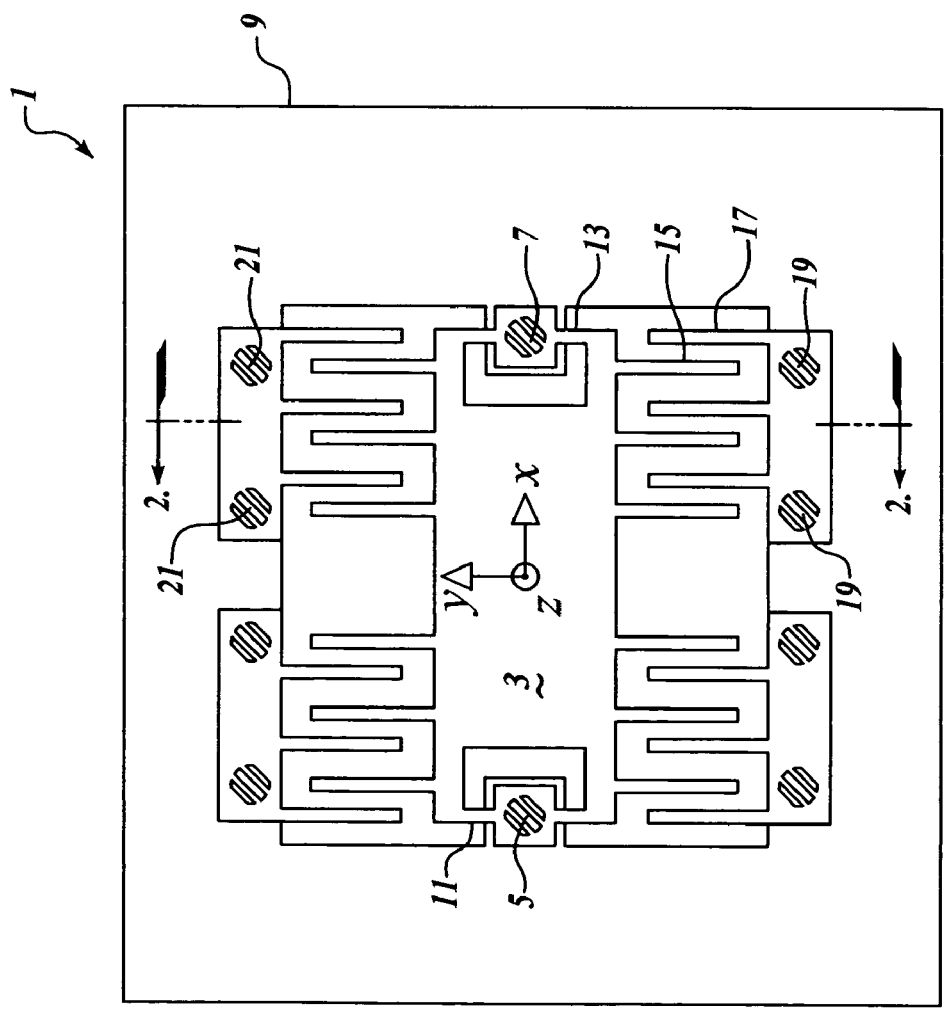

FIGS. 1 and 2 illustrate a known capacitive readout in-plane accelerometer fabricated as a high aspect ratio MEMS or HIMEMS device that suffers from cross-axis sensitivity due to out-of-plane (shown as ±z axis) separation or "de-meshing" of the fingers in response to positively and negatively applied out-of-plane forces or accelerations, wherein FIG. 1 is a plan view and FIG. 2 is a cross-sectional end view. The capacitive readout in-plane accelerometer device 1 includes a proof mass 3 suspended at two end points 5, 7 from a frame 9 formed in a substrate. The proof mass 3 is usually secured to the frame 9 by an anodic bond or adhesive indicated generally at the end points 5, 7. The proof mass 3 is suspended at each of the two end points 5, 7 by a respective pair of flexures 11, 13 for motion along the sensitive axis of the device 1, which is illustrated here as the x-axis. When the HIMEMS device 1 is a capacitive readout in-plane accelerometer, as illustrated in FIGS. 1 and 2, the proof mass 3 may be equipped with a quantity of comb-like fingers 15 projected outwardly from the main body of the proof mass, indicated at 3. Each of the fingers 15 cooperates with an electrode finger 17 to form one of a quantity of capacitors. Surfaces of the fingers 15 in the y-z plane and cooperating surfaces electrode fingers 17, also in the y-z plane, form opposing plates of a capacitor formed therebetween. The cooperating electrode fingers 17 are rigidly secured to the frame 9 by an anodic bond or adhesive indicated generally at intermittent points 19, 21. The electrode fingers 17 are thereby fixed relative to the moveable proof mass fingers 15. As a positive or negative force is applied along the x-axis, the proof mass 3 and associated capacitor plates formed on the fingers 15 approach or recede from the cooperating capacitor plates formed on the relatively fixed electrode fingers 17, whereby capacitance between the cooperating fingers 15, 17 increases or decreases. In an accelerometer device, the change in capacitance is a measure of the acceleration force applied to the proof mass 3.

An in-plane acceleration or other force applied to the proof mass 3 along the sensitive or x-axis may have a cross-axis component, shown in the example as the y-axis.

However, such in-plane cross or y-axis component is masked by one or both of the over-lap of the proof mass and fixed electrode fingers 15, 17; and a change in capacitance between the fingers 15, 17 on one side of the proof mass 3 being matched by an equal and opposite change between the fingers 15, 17 on the opposite side of the proof mass.

Such compensating effects are not present in HIMEMS devices for out-of-plane components of the applied force or acceleration. Because the HIMEMS process operates only on a substrate of uniform thickness, the proof mass fingers 15 and fixed electrode fingers 17 must be formed having identical cross-axis width, i.e., z-axis dimension. In practical terms, the fixed electrodes 17 cannot be formed oversized in the z-axis dimension relative to the proof mass fingers 15, whereby changes in capacitance would be eliminated for motion of the proof mass fingers 15 along the z-axis. Nor is a resultant capacitance decrease from off-set along the z-axis of the proof mass fingers 15 relative to the fixed electrode fingers 17 compensated by an equal and opposite increase in capacitance on the opposite side of the proof mass.

Rather, as illustrated in FIG. 2, a force or component of force applied out-of-plane, i.e., acting along the z-axis, causes the proof mass 3 and its associated capacitor plates formed on the fingers 15 to translate along the z-axis relative to the fixed electrodes 17 which are supported against such movement. The proof mass fingers 15 "de-mesh" or become off-set relative to the normally intermeshing fixed electrodes 17. The result of this de-meshing or relative off-set is a decrease in capacitance between the fingers 15, 17. The decrease in capacitance appears as a reduction in the acceleration or other force operating along the x-axis, thereby resulting in an inaccurate indication.

Figure 4:
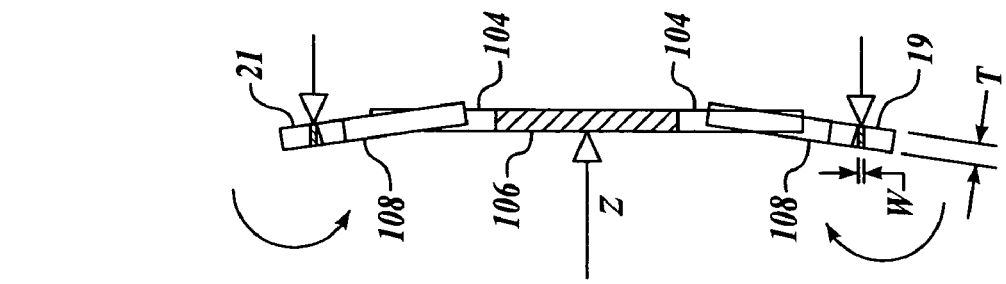
Figure 3:
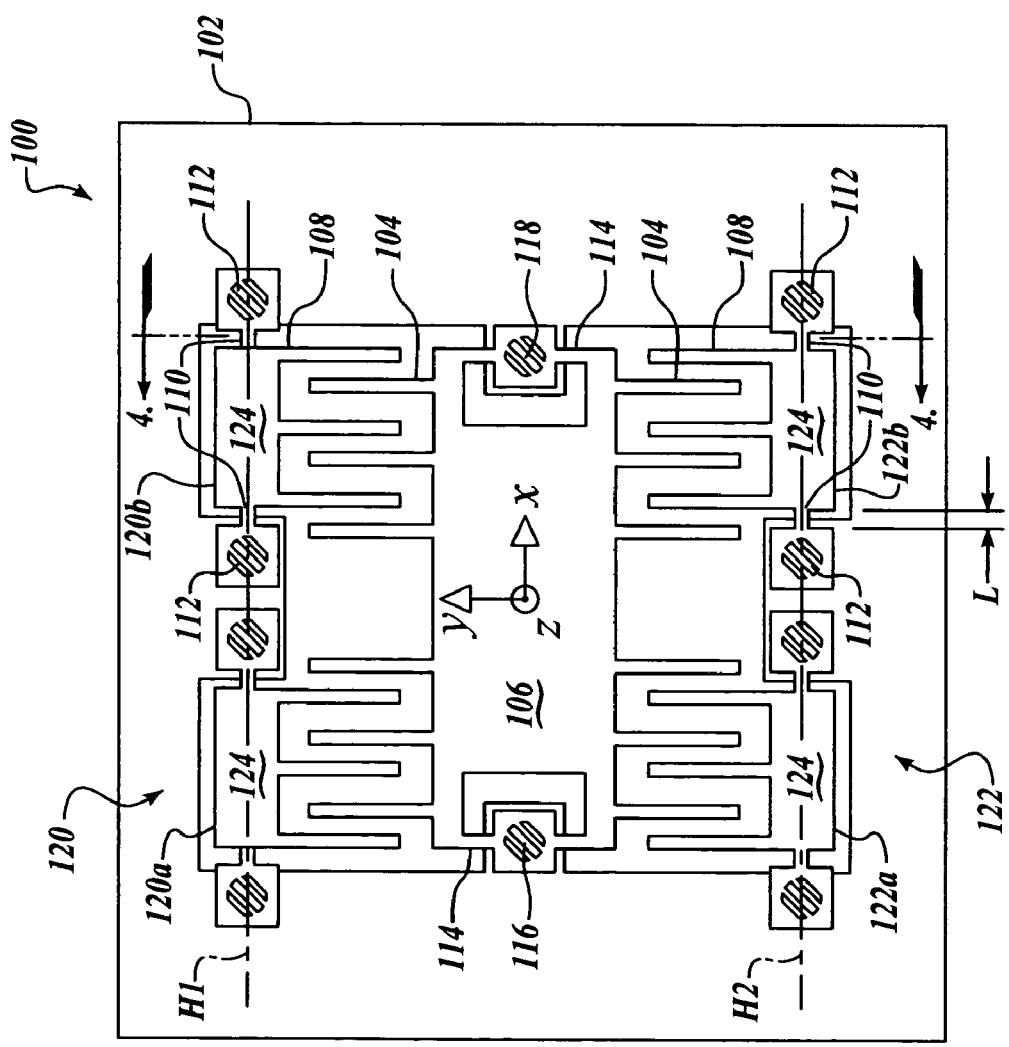

FIG. 3 and FIG. 4 illustrate the suspension apparatus and method of the invention for compensating out-of-plane displacements of a proof mass in an in-plane capacitive readout force transducer fabricated as a high aspect ratio MEMS or HIMEMS device for measuring an applied force, such as an accelerometer, wherein FIG. 3 is a top-down plan view and FIG. 4 is an end-on cross-sectional view taken through the device illustrated in FIG. 3, including the suspension apparatus of the invention. In FIG. 3 the invention is embodied in an in-plane comb-type capacitive readout force transducer device 100 mounted on an instrument frame 102. Capacitor plate fingers 104 on opposite sides of a proof mass 106 are matched by finger electrodes 108 secured on the frame 102. The finger electrodes 108 are mounted using a pivoting suspension formed of one or more torsional flexures 110 coupled between the finger electrodes 108 and attachment points 112 securing them to the frame 102.

As illustrated in FIG. 4, when an acceleration or other force is applied having a component out of the plane of the device 100, shown as the z-axis in the example, the proof mass 106 tends to move slightly out-of-plane, i.e., along the z-axis, the motion being exaggerated in the illustration. Because the proof mass 106, including the fingers 104, is substantially symmetric as are the flexures 114 suspending it for motion along the sensitive or x-axis, the proof mass tends to translate out-of-plane when an out-of-plane force is applied, as illustrated in FIG. 4, rather than rotate. Furthermore, the degree of translation of the proof mass 106 is a function of the out-of-plane force that is applied.

According to one embodiment of the invention, when an out-of-plane force is applied the finger electrodes 108 on the frame 102 rotate as a unit on the flexures 110 about an axis parallel to the sensitive axis of the device, shown as the x-axis. The degree of rotation of the finger electrodes 108 relative to the frame 102 is a function of the out-of-plane force that is applied and the stiffness of the torsional flexures 110 which is adjusted such that the rotated position of the finger electrodes 108 on the frame 102 substantially exactly matches the translated position of the capacitor plate fingers 104 on the proof mass 106. Therefore, the over-lap of the proof mass and frame electrode fingers 104, 108 remains substantially constant during out-of-plane translation of the proof mass 106 and the capacitance change associated with such out-of-plane translation is substantially eliminated.

In a more detailed description of the invention embodied as an accelerometer, as illustrated in FIGS. 3 and 4, the in-plane comb-type capacitive readout force transducer HIMEMS device 100 is mounted on the instrument frame 102 which is formed in a substrate, such as a silicon substrate, having substantially planar and mutually parallel spaced apart upper and lower surfaces shown parallel with the plane of the paper. The frame 102 is structured such that the proof mass 106 and the frame electrodes 108 have sufficient space to move out-of-plane to a desired degree responsiveness of the device to an acceleration force applied substantially along the sensitive axis is not impaired. Alternatively, the proof mass 106 and frame electrodes 108 are sufficiently spaced away from the planar surface of the frame 102, whereby the proof mass 106 is separated from the die, allowing it to translate on the flexures 114 such that responsiveness is not impaired.

Using HIMEMS fabrication techniques the proof mass 106 and frame electrodes 108 are formed in a substrate, such as a silicon substrate, having substantially planar and mutually parallel spaced apart upper and lower surfaces shown parallel with the plane of the paper. The proof mass 106 is formed having substantially uniform width and being substantially symmetric relative to the major and minor in-plane axes, i.e., x-axis and y-axis. The proof mass 106 is formed with one or more flexures 114 at one or more locations, the flexures 114 being structured for flexibility along the major x-axis of the proof mass 106 between the main body of the proof mass and respective attachment points 116, 118 positioned on the center line of the proof mass 106. The proof mass 106 is additionally formed with a quantity of the electrodes 104 embodied as fingers spaced along its length or major axis and projected outwardly from each of its two side edges. The electrode fingers 104 are aligned substantially crosswise to the proof mass major x-axis. In practice, surfaces of the electrode fingers 104 substantially in the y-z plane of the device are formed as individual substantially planar capacitor plates that are oriented substantially crosswise to the proof mass major x-axis.

First and second quantities of frame electrode fingers 108 are spaced on opposite sides of the proof mass 106 and are aligned substantially crosswise to the proof mass major x-axis. The two sets of frame electrode fingers 108 are positioned in the spaces between the proof mass electrode fingers 104 and inter-meshed with them such that small spaces are provided therebetween. One or both surfaces on each side of the frame electrode fingers 108 formed substantially in the y-z plane of the device forms an individual substantially planar capacitor plate, the capacitor plates being oriented substantially crosswise to the major x-axis of the proof mass. The capacitor plates of the frame electrode fingers 108 cooperate with the capacitor plates of the proof mass electrode fingers 104 for forming capacitors therebetween when an electrical charge is applied thereto, as is known in the art.

According to one embodiment of the invention, the first and second quantities of frame electrode fingers 108 are grouped into different sets 120, 122 on each side of the proof mass 106. The sets 120, 122 on each side of the proof mass 106 are further divided into a number of smaller sets 120a, 120b and 122a, 122b, respectively, as illustrated. Each set 120, 122 or 120a, 120b and 122a, 122b is mechanically coupled through a respective spine or strong-back 124 which is elongated and substantially rigid so that all the electrode fingers 108 projected therefrom move, i.e., rotate or pivot, in concert. The coupled sets 120, 122 or 120a, 120b and 122a, 122b of electrode fingers 108 are individually mounted and substantially fixedly secured to the frame 102 at attachment points 112, one attachment point 112 being provided at each end of the coupled set and aligned along a respective axis of rotation H1, H2 that is substantially parallel to the sensitive axis of the device, i.e., the x-axis. The attachment points 112 are formed as substantially rigid blocks of the substrate material and fixedly secured to the frame 102 by, for example, an adhesive.

The torsional flexures 110 pivotally couple each end of the elongated and substantially rigid spine 124 to the attachment point blocks 112. The torsional flexures 110 provide sufficient columnar strength that the respective sets 120, 122 or 120a, 120b and 122a, 122b of frame electrode fingers 108 are positionally fixed to the frame 102 relative to the sensitive axis of the device 100. In other words, at least the combined tensile and compressive strengths of the torsional flexures 10 is sufficient to hold the frame electrode fingers 108 against moving in the sensitive axis when the device experiences an acceleration or other force. The frame electrode fingers 108 thus provide a reference for the capacitors formed between the proof mass and frame electrode fingers 104, 108.

According to one embodiment of the invention, the torsional flexures 110 are formed in a single substrate with the frame electrode fingers 108 and spine 124 as well as the proof mass 106. The HIMEMS fabrication process causes the torsional flexures 110 to be formed of the same uniform thickness T (FIG. 4) with the frame electrode fingers 108 and spine 124 as well as the proof mass 106. Additionally, the torsional flexures 110 are formed having a significantly long length L (FIG. 3) in the rotational or H1 or H2-axis relative to the width W (FIG. 4) as measured in the crosswise or y-axis. This relatively narrow width W permits the flexures 110 to be twisted about the respective rotational or H1 or H2-axis without breaking while a first end of each remains stationary and fixed relative to the frame 102 and a second remains fixed relative to the respective spine 124 and rotates therewith.

As shown in the illustration, the frame electrode fingers 108 are provide only on one side of the spine 124. The resultant frame electrode structures, indicated at 120, 122, are thus cantilevered such that an acceleration or other force applied out-of-plane causes the combined spine 124 and projected electrode fingers 108 to pivot or rotate about the sensitive or x-axis, as illustrated in FIG. 4. The cross-axis dimensions of the torsional flexures 110 for width W and sensitive or x-axis length L are selected in a combination that causes the frame electrode structures, indicated at 120, 122, to be balanced in a zero-g environment, i.e., with no out-of-plane acceleration or other force applied. The cross-axis thickness and sensitive or x-axis length dimensions of the torsional flexures 110 are further selected in a combination that causes the frame electrode structures, indicated at 120, 122, to permit the projected electrode fingers 108 to pivot or rotate in concert with the proof mass electrode fingers 104 in response to an acceleration or other force applied out-of-plane. In other words, the effective spring constant of the torsional flexures 110 in combination with the respective frame electrode structures, indicated at 120, 122, is selected to match that of the one or more flexures 114 in combination with the proof mass 106.

Rotation of the frame electrode structures, indicated at 120, 122, causes the over-lap of the proof mass electrode fingers 104 and frame electrode fingers 108 to remain substantially constant during out-of-plane translation of the proof mass 106 and the capacitance change associated with such out-of-plane translation is thereby substantially eliminated.

While the preferred embodiment of the invention has been illustrated and described, it will be appreciated that various changes can be made therein without departing from the spirit and scope of the invention.

What is claimed is:

1. A high aspect ratio microelectromechanical system device for measuring an applied force, the device comprising:
   a frame;
   a proof mass coupled to the frame for in-plane motion along an axis of symmetry, the proof mass having first and second pluralities of spaced apart capacitor plates projected therefrom on each side of the axis of symmetry and oriented substantially crosswise to the axis of symmetry; and
   third and fourth pluralities of spaced apart capacitor plates oriented substantially crosswise to the axis of symmetry of the proof mass and intermeshed respectively with the first and second pluralities of capacitor plates, the third and fourth pluralities of capacitor plates being suspended for rotational motion relative to the frame about respective first and second axes of rotation oriented substantially parallel with the axis of symmetry of the proof mass.

2. The device of claim 1, further comprising first and second torsional flexures respectively coupled between the third and fourth pluralities of capacitor plates and the frame.

3. The device of claim 2 wherein each of the first and second torsional flexures further comprises a pair of torsional flexures spaced at opposite ends of the respective third and fourth pluralities of capacitor plates.

4. The device of claim 3, further comprising an attachment structure coupled between each of the first and second torsional flexures and the frame.

5. The device of claim 4 wherein a first end of each of the first and second torsional flexures is fixed relative to the attachment structure and a second end is fixed relative to the respective third and fourth pluralities of capacitor plates.

6. The device of claim 3 wherein each of the first and second torsional flexures further comprises a beam-shaped flexure having a length dimension measured along the respective axis of rotation that is greater than a width dimension measured crosswise to the axis of symmetry of the proof mass.

7. A high aspect ratio microelectromechanical system device for measuring an applied force, the device comprising:
   a proof mass having first and second pluralities of electrodes extending on opposing first and second sides of an axis of symmetry and having spaces formed between adjacent electrodes;
   first and second sets of reference electrodes being spaced from the proof mass on the opposing first and second sides of the axis of symmetry, each set of reference electrodes further comprising a plurality of electrodes positioned in the spaces between the respective first and second pluralities of proof mass electrodes;

a frame;

one or more proof mass flexures suspending the proof mass relative to the frame for displacement along the axis of symmetry; and first and second reference electrode flexures suspending the respective first and second sets of reference electrodes relative to the frame for motion about respective first and second axes substantially parallel with the proof mass axis of symmetry.

8. The device of claim 7, further comprising a substrate whereof the proof mass and the first and second sets of reference electrodes are formed.

9. The device of claim 8 wherein the proof mass and the first and second sets of reference electrodes are formed having substantially the same uniform thickness.

10. The device of claim 7 wherein the first and second reference electrode flexures further comprise first and second pluralities of electrodes.

11. The device of claim 10 wherein one end of each of the first and second reference electrode flexures is mechanically coupled in fixed relation to the frame.

12. The device of claim 11 wherein each of the first and second reference electrode flexures is long as measured in the respective first and second axes relative to a respective width measured crosswise to the respective first and second axes.

13. An in-plane comb-type capacitive readout force transducer fabricated as a high aspect ratio microelectromechanical system device for measuring an applied force, the transducer comprising:

an instrument frame;

a substrate of substantially uniform thickness having substantially planar and mutually parallel spaced apart upper and lower surfaces;

a proof mass formed in the substrate of substantially uniform width and length and suspended by one or more flexures at each of two opposing ends for motion relative to the frame in the plane of the substrate and along an axis of motion crosswise to the width, the proof mass having on each of two edges spaced apart by the width a plurality of outwardly projected electrode fingers spaced along the length and aligned substantially crosswise to the axis of motion and forming individual substantially planar capacitor plates oriented substantially crosswise to the axis of motion; and first and second pluralities of frame electrode fingers formed in the substrate and spaced on opposite sides of the proof mass and substantially fixedly secured to the frame relative to the axis of motion of the proof mass, the first and second pluralities of frame electrode fingers being inwardly projected toward the proof mass and inter-spaced with the outwardly projected electrode fingers spaced along the length of the proof mass and forming individual substantially planar capacitor plates oriented substantially crosswise to the axis of motion of the proof mass and cooperating with the capacitor plates of the proof mass for forming individual capacitors therebetween when an electrical current is applied thereto, each of the first and second pluralities of frame electrode fingers being suspended by one or more torsional flexures for motion relative to the frame about respective first and second axes of rotation aligned substantially parallel with the axis of motion of the proof mass.

14. The transducer of claim 13 wherein one or more torsional flexures suspending each of the first and second pluralities of frame electrode fingers are coupled to an attachment structure that is fixedly secured to the frame.

15. The transducer of claim 13 wherein the one or more torsional flexures suspending each of the first and second pluralities of frame electrode fingers are structured having a length measured along the respective axis of rotation that is greater than a width measured crosswise to the axis of motion of the proof mass.

16. The transducer of claim 13 wherein each of the first and second pluralities of frame electrode fingers further comprises a plurality of sets of frame electrode fingers, each of the sets of frame electrode fingers being suspended by pairs of torsional flexures for rotation relative to the frame about one of the respective first and second axes of rotation.

17. The transducer of claim 13, further comprising first and second spines each structured as a substantially rigid support structure interconnecting the respective first and second pluralities of frame electrode fingers.

18. The transducer of claim 17, further comprising substantially rigid attachment structure fixedly secured to the frame, the one or more torsional flexures suspending each of the first and second pluralities of frame electrode fingers being interconnected between each of the spines and the attachment structure.

19. A method of forming a suspension structure for compensating out-of-plane displacements of a proof mass of a device formed as a high aspect ratio microelectromechanical system, the method comprising:

forming a frame in a first substrate, using a high aspect ratio microelectromechanical system method of fabrication, forming in a second substrate, a proof mass having first and second sets of spaced apart capacitor plates projected therefrom on each side of an axis of symmetry and oriented substantially crosswise to the axis of symmetry, one or more in-line flexures coupled to the proof mass in line with the axis of symmetry, third and fourth sets of spaced apart capacitor plates oriented substantially crosswise to the axis of symmetry of the proof mass and intermeshed respectively with the first and second sets of capacitor plates, and first and second torsional flexures coupled to the third and fourth sets of capacitor plates along respective first and second axes of motion substantially aligned with the axis of symmetry of the proof mass;

securing the in-line flexures for suspending the proof mass for primary motion along the axis of symmetry; and securing ends of the first and second torsional flexures for suspending the third and fourth sets of capacitor plates for motion about the respective first and second axes of motion.

20. The method of claim 19 wherein each of the first and second torsional flexures further comprises a pair of torsional flexures coupled at opposite ends of the third and fourth sets of capacitor plates, and securing ends of the first and second torsional flexures further comprises securing ends of the first and second torsional flexures distal from the ends of the third and fourth sets of capacitor plates.

21. The method of claim 20 wherein securing ends of the first and second torsional flexures distal from the ends of the third and fourth sets of capacitor plates further comprises securing an attachment structure formed at the ends of the first and second torsional flexures distal from the third and fourth sets of capacitor plates suspended thereby.

22. The method of claim 19 wherein forming first and second torsional flexures further comprises forming first and second pairs of torsional flexures having a length along the respective first and second axes of motion relative to a width crosswise to the respective first and second axes of motion that causes the respective third and fourth sets of capacitor plates to rotate relative to the frame in response to a force applied perpendicular to a plane containing the proof mass.

* * * * *